(12) United States Patent
Spirkl et al.

(10) Patent No.: US 7,757,132 B2
(45) Date of Patent: Jul. 13, 2010

(54) MEMORY WITH AN OUTPUT REGISTER FOR TEST DATA AND PROCESS FOR TESTING A MEMORY AND MEMORY MODULE

(75) Inventors: Wolfgang Spirkl, Germering (DE); Martin Brox, Munich (DE)

(73) Assignee: Qimonda AG, Munich (DE)

( * ) Notice: Subject to any disclaimer, the term of this patent is extended or adjusted under 35 U.S.C. 154(b) by 293 days.

(21) Appl. No.: 11/752,907

(22) Filed: May 23, 2007

(65) Prior Publication Data

US 2008/0010438 A1 Jan. 10, 2008

(30) Foreign Application Priority Data

May 23, 2006 (DE) .................. 10 2006 024 016

(51) Int. Cl.
*G11C 29/00* (2006.01)
(52) U.S. Cl. .................................... 714/718
(58) Field of Classification Search ............. 714/718, 714/719, 735, 819, 769; 711/105
See application file for complete search history.

(56) References Cited

U.S. PATENT DOCUMENTS

| | | | |
|---|---|---|---|
| 5,428,575 A | 6/1995 | Fudeyasu | |
| 5,502,215 A * | 3/1996 | Yamaguchi et al. | 549/274 |
| 5,925,142 A * | 7/1999 | Raad et al. | 714/719 |
| 5,966,388 A * | 10/1999 | Wright et al. | 714/719 |
| 6,032,274 A * | 2/2000 | Manning | 714/718 |
| 6,154,860 A * | 11/2000 | Wright et al. | 714/718 |
| 6,173,425 B1 * | 1/2001 | Knaack et al. | 714/718 |
| 6,198,669 B1 | 3/2001 | Iguchi | |
| 6,243,840 B1 * | 6/2001 | Raad et al. | 714/719 |
| 6,550,026 B1 * | 4/2003 | Wright et al. | 714/719 |

FOREIGN PATENT DOCUMENTS

| | | |
|---|---|---|
| DE | 4328605 | 3/1994 |
| DE | 19951534 | 5/2000 |

* cited by examiner

*Primary Examiner*—Phung M Chung
(74) *Attorney, Agent, or Firm*—Patterson & Sheridan, L.L.P.

(57) ABSTRACT

The invention relates to a memory with a memory array with memory cells, with an input/output circuit which is connected to the memory cells and which interchanges data with the memory cells, with an output register which is connected to the input/output circuit, with the output register being used to output data via a data output, having an input register which is connected to a data input and to the input/output circuit, with the data input and the input register being used to input data into the memory cells, with test data being written to the output register in a test mode. The invention furthermore relates to a process for testing a memory and to a memory module.

15 Claims, 5 Drawing Sheets

MEMORY WITH AN OUTPUT REGISTER FOR TEST DATA AND PROCESS FOR TESTING A MEMORY AND MEMORY MODULE

CROSS-REFERENCE TO RELATED APPLICATIONS

This application claims foreign priority benefits under 35 U.S.C. §119 to co-pending German patent application number DE 10 2006 024 016.2-55, filed May 23, 2006. This related patent application is herein incorporated by reference in its entirety.

BACKGROUND OF THE INVENTION

Memories are known in the form of various embodiments, such as DRAMs, SRAMs, in particular Double Data Rate DRAMs. The memories have input/output circuits which are connected to input registers and output registers. The input registers are used to make data available to the input/output circuit for writing to the memory cells. The output registers are used to output data from the input/output circuit. The input and output registers output data via data outputs of the memory or receive data via the data inputs of the memory. The input and output registers can be operated with different data widths and at different clock rates than the input/output circuit when writing or reading data.

To test the operability of the memories, it may be necessary to introduce test data into the memory's data stream. To this end, it is known practice to connect external testers to the data inputs and to the data outputs of the memory.

For testing a separate test pattern generator may be connected to the data path of the input/output circuit via a data multiplexer. On account of the high data rate, however, there may be the risk that time delays and impairment of the data signal will be caused by the arrangement of the multiplexer. In addition, it is a complex matter to distribute the test data from the test pattern generator over the data inputs of the memory.

SUMMARY OF THE INVENTION

The invention can be implemented in a plurality of embodiments. In a first embodiment, a separate test data circuit is provided which is used to write the test data to the output register. In a second embodiment, the test data from the memory's memory array are written to the output register.

One embodiment may feed test data into the data stream via the output register. This may largely prevent signal delays and impairments to the data signals. In addition, only a slight change in the design of the memory may be required in order to provide this test function.

In another embodiment, the evaluation circuit is connected to the input register and checks the result data which are obtained using the test processes carried out with test data. Linking the evaluation circuit to the input register allows simple control of the result data.

In another embodiment, the evaluation circuit compares the result data with stipulated comparison data. If the result of the comparison is that the result data differ from the comparison data then an error signal is output.

In another embodiment, the output register is in the form of a first-in-first-out memory (FIFO). In this embodiment, the FIFO memory can be filled with a plurality of test data and then the test data can be supplied to the input/output circuit serially via the input register. This allows a periodic test pattern to be produced. During the test mode, transmission of data from the input/output circuit to the output register is prevented.

A further embodiment may not require external test pattern generators with high clock rates, but rather the clock frequency may be provided using an internal clock source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention relates to a memory having a memory array having memory cells, having an input/output circuit which can be used to interchange data with the memory cells. The invention also relates to a process for testing a memory having a memory array having memory cells having an input/output unit which can be used to interchange data with the memory cells. To test the memory, test data are prescribed which are used to check the correct mode of operation of the memory.

Furthermore, the invention relates to a memory module and to a computer system.

The invention may be used in a wide variety of memory types and may only require a slight change in the circuit design of the memory.

Figure 1:
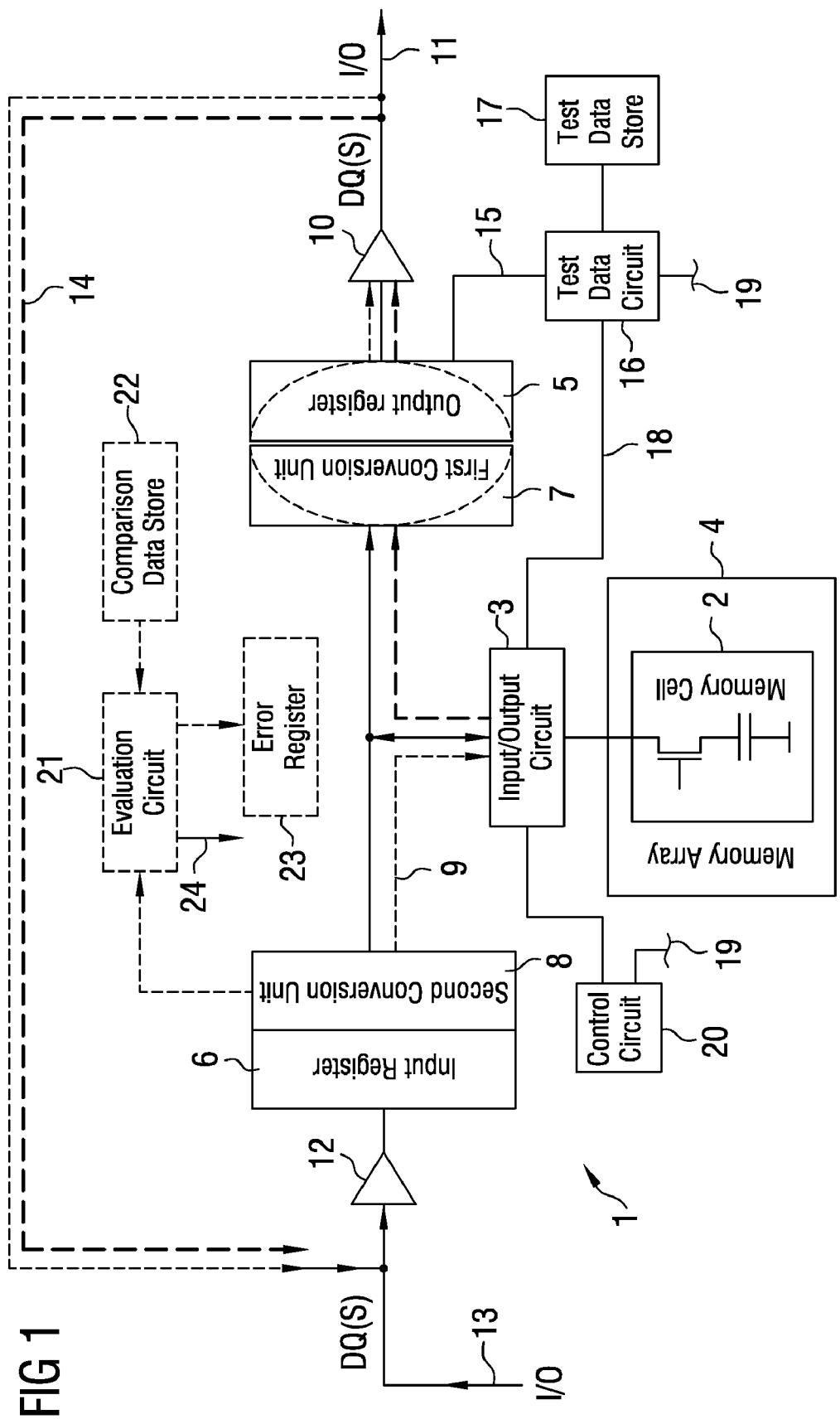
FIG. 1 shows a schematic design for a first embodiment of a memory where the test data are fed into the output register.

FIG. 1 shows the first embodiment with a schematic partial detail from a memory 1 having a memory array 4 having memory cells 2. The input/output circuit 3 can be used to write data to the memory cells 2. A memory cell 2 has a selection transistor which can be turned on via a control line. In the on state, the selection transistor connects a storage element, for example a capacitor, to a read line. By way of example, the memory cells 2 are dynamic memory cells whose memory content needs to be refreshed at regular intervals of time. The memory cells may also be static memory cells, which store the stored information without refresh operations. The memory 1 may be in the form of a memory with random access to individual memory cells. Depending on the chosen embodiment, the input/output circuit 3 may also have an amplifier circuit for amplifying the data signal from the memory cells. The input/output circuit 3 is connected to an output register 5 and to an input register 6 by means of a bidirectional data bus 9. Depending on the chosen bandwidth of the data bus and the data width of the output register 5, a first conversion unit 7 is arranged between the data bus 9 and the output register 5 and buffer-stores the data signals and rearranges the data signals from parallel data signals into serial data signals. In this way, the greater data width of the data bus 9 is brought into line with the lesser data width of the output register 5.

In addition, a second conversion unit 8 may be provided between the input register 6 and the data bus 9, said conversion unit bringing the lesser data width of the input register 6 into line with the greater data width of the data bus 9 and performing serial/parallel rearrangement of the data signals. The first and second conversion units 7, 8 allow the output register 5 and the input register 6 to read in data at a higher clock rate than the data are interchanged between the first and second conversion units 7, 8 and the input/output circuit 3 via the data bus 9. The first and second conversion units 7, 8 have appropriate data latches, i.e. data stores in which the data are buffer-stored. In addition, the input register 6 and the output register 5 are supplied with a clock. The clock prescribes the times at which data are written to the input and output registers 6, 5 and at which data are read from the input and output registers 6, 5.

The output register 5 is connected to data outputs 11 via output drivers 10. The input register 6 is connected to a receiver circuit 12 which is connected to data inputs 13 of the memory. Between the output driver 10 and the driver circuit 12, a data link 14 is provided which is used to return output data which are output by the output driver 10 directly to the receiver circuit 12. By way of example, the data link 14 is in the form of an external data line which is connected to the data inputs 13 and to the data outputs 11. The data link 14 may also be integrated on the memory and may connect the output register 5 to the input register 6. In this case, the data link may be connected between the output driver 10 and the receiver circuit 12.

In the first embodiment, the output register 5 is connected to a test data circuit 16 by means of a connecting line 15. The test data circuit 16 generates test data itself or is connected to a test data store 17 in which test data are stored. In addition, the test data circuit 16 is connected to the input/output circuit 3 by means of a control line 18. Furthermore, the test data circuit 16 has an input 19 via which the test data circuit 16 can be supplied with a control signal from a control circuit 20, which control signal is used to start the performance of a test process.

The input register 6 is connected to an evaluation circuit 21 either directly or via the second conversion unit 8. The evaluation circuit 21 is connected to a comparison data store 22 and/or to an error register 23.

To perform a read test process, the test data circuit 16 receives a test read command via the input 19. The test data circuit 16 then sends a stop signal to the input/output circuit 3. Having received the stop signal, the input/output circuit 3 prevents further data output by the data bus 9 to the output register 5. The output register 5 continues to output the data which are still stored in the output register 5 via the output drivers 10.

Next, the connecting line 15 is used to write test data from the test data circuit 16 to the output register 5. In a subsequent process step, the output register 5 passes the test data via the output drivers 10 and the data link 14 to the receiver circuit 12, which forwards the test data to the input register 6. The test data are made available to the input/output circuit 3 by the input register 6 via the second conversion unit 8. The input/output circuit 3 performs a test process on the basis of a supplied control command.

By way of example, the test process involves the test data which are supplied via the input register 6 being stored in stipulated memory cells. The input/output circuit 3 stores the test data in the stipulated memory cells. Next, the input/output circuit 3 reads the test data stored in the stipulated memory cells as result data and forwards them to the output register 5 via the data bus 9 and the first conversion unit 7. The output register 5 returns the result data to the input register 6 via the output driver 10, the data link 14 and the receiver circuit 12. The result data returned to the input register 6 are detected by the evaluation circuit 21 and are compared with comparison data. The comparison data correspond to the data which are obtained with a correct mode of operation when performing the test process. If the result of the comparison is that the result data differ from the comparison data then a malfunction is identified and an error signal is output by the evaluation circuit 21 via an output 24. Depending on the chosen embodiment, the occurrence of a malfunction may prompt an error data item to be written to the error register 23.

The comparison data may also be stored in the comparison data store 22 and may be read from the comparison data store 22 during the comparison by the evaluation circuit 21. During the test process, the supply of input data via the data input 13 is prevented by the control unit 20.

For a read test, the input/output circuit 3 is supplied with an appropriate control signal by the control circuit 20. Next, the input/output circuit 3 performs the prescribed read test by reading the data stored in stipulated memory cells and forwarding them to the output register 5. Depending on the selected embodiment, test data are stored in the stipulated memory cells 2 via the output register 5, the output drivers 10, the data output 11, the data link 14, the receiver circuit 12, the input register 6, the second conversion unit 8 and the input/output circuit 3, as described above. The data which have been read are supplied to the input register 6 by the output register 5 via the output drivers 10, the data link 14 and the receiver circuit 12. The evaluation circuit 21 compares the data which have been read in the test process and which are stored in the input register 6 with prescribed comparison data. If the result of the comparison is that the data which have been read do not match the comparison data then an error signal is output via the output 24. Depending on the chosen embodiment, an error data item may also be written to the error register 23. The comparison data correspond to the data which are obtained with a correct mode of operation when the test process is performed.

Figure 2:
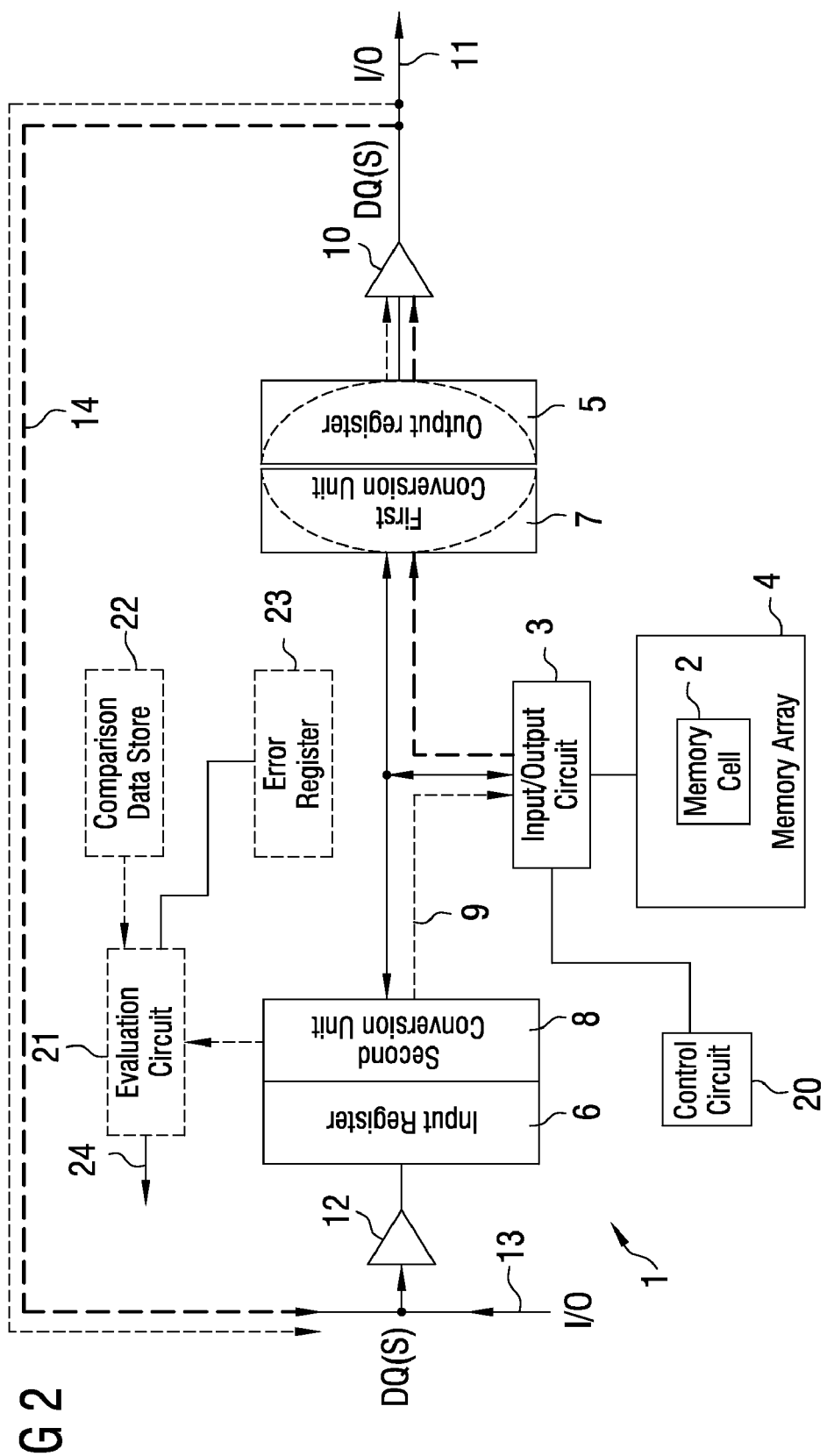
FIG. 2 shows a second embodiment of a memory having a comparison circuit which checks the result data for a signature.

FIG. 2 shows a detail from the second embodiment with a memory 1 having a memory array 4 having memory cells 2.

The input/output circuit 3 can be used to write data to the memory cells 2. A memory cell 2 has a selection transistor which can be turned on via a control line. In the on state, the selection transistor connects a storage element, for example a capacitor, to a read line. By way of example, the memory cells 2 are dynamic memory cells whose memory content needs to be refreshed at regular intervals of time. The memory cells may also be static memory cells, which store the stored information without refresh operations. The memory 1 may be in the form of a memory with random access to individual memory cells. Depending on the chosen embodiment, the input/output circuit 3 may also have an amplifier circuit for amplifying the data signal from the memory cells. The input/output circuit 3 is connected to an output register 5 and to an input register 6 by means of a bidirectional data bus 9. Depending on the chosen data width of the data bus and the data width of the output register 5, a first conversion unit 7 is arranged between the data bus 9 and the output register 5 and buffer-stores the data and rearranges the data from parallel data signals into serial data signals. This brings the greater data width of the data bus 9 into line with the lesser data width of the output register 5.

In addition, a second conversion unit 8 may be provided between the input register 6 and the data bus 9 and brings the lesser data width of the input register 6 into line with the greater data width of the data bus 9 and performs serial/parallel rearrangement of the data signals. The first and second conversion unit 7, 8 allow the output register 5 and the input register 6 to read in data at a higher clock rate than the data are interchanged between the first and second conversion units 7, 8 and the input/output circuit 3 via the data bus 9. The first and second conversion units 7, 8 have appropriate data latches, i.e. data stores which buffer-store the data. In addition, the input register 6 and the output register 5 are supplied with a clock. The clock prescribes the times at which data are written to the input and output registers 6, 5 and at which data are output from the input and output registers 6, 5.

The output register 5 is connected to data outputs 11 via output drivers 10. The input register 6 is connected to a receiver circuit 12 which is connected to data inputs 13 of the memory. The output drivers 10 and the receiver circuit 12 have a data link 14 provided between them which is used to return output data which are output by the output driver 10 directly to the receiver circuit 12. By way of example, the data link 14 is in the form of an external data line which is connected to the data inputs 13 and to the data outputs 11. The data link 14 may also be integrated on the memory and can connect the output register 5 to the input register 6.

The input register 6 is connected to an evaluation circuit 21 either directly or via the second conversion unit 8. The evaluation circuit 21 is connected to a comparison data store 22 and/or to an error register 23.

To perform a read test process, the input/output circuit 3 receives a test read command from the control circuit. Having received the test command, the input/output circuit 3 prevents further data output via the data bus 9 to the output register 5. The output register 5 continues to output the data which are still stored in the output register 5 via the output driver 10 and the data outputs 11.

Next, the input/output circuit 3 writes test data stored in memory cells in the memory array 4 from the memory array 4 to the output register 5. In a subsequent process step, the output register 5 passes the test data via the output drivers 10 and the data link 14 to the receiver circuit 12, which forwards the test data to the input register 6. The test data are made available to the input/output circuit 3 by the input register 6 via the second conversion unit 8. The input/output circuit 3 performs a test process on the basis of a supplied control command.

By way of example, the test process involves the test data which are supplied via the input register 6 being stored in stipulated memory cells. The input/output circuit 3 stores the test data in the stipulated memory cells. Next, the input/output circuit 3 reads the test data stored in the stipulated memory cells as result data and forwards them to the output register 5 via the data bus 9 and the first conversion unit 7. The output register 5 returns the result data to the input register 6 via the output driver 10, the data link 14 and the receiver circuit 12. The result data returned to the input register 6 are detected by the evaluation circuit 21 and are compared with comparison data. The comparison data correspond to the data which are obtained with the correct mode of operation when the test process is performed. If the result of the comparison is that the result data differ from the comparison data then a malfunction is identified and an error signal is output by the evaluation circuit 21 via an output 24. Depending on the chosen embodiment, the occurrence of a malfunction can prompt an error data item to be written to the error register 23.

The comparison data may also be stored in the comparison data store 22 and may be read from the comparison data store 22 during the comparison by the evaluation circuit 21. During the test process, the supply of input data via the data input 13 is prevented by the control unit 20.

For a read test, the input/output circuit 3 is supplied with an appropriate control signal by the control circuit 20. Next, the input/output circuit 3 performs the prescribed read test by reading the data stored in stipulated memory cells and forwarding them to the output register 5. The data which have been read are supplied to the input register 6 by the output register 5 via the output drivers 10, the data link 14 and the receiver circuit 12. The evaluation circuit 21 compares the data which have been read in the test process and which have been stored in the input register 6 with prescribed comparison data. If the result of the comparison is that the data which have been read do not match the comparison data then an error signal is output via the output 24. Depending on the chosen embodiment, an error data item can also be written to the error register 23.

In the second embodiment, no test data circuit 16 is provided and the test data are written to the output register 5 directly by the input/output circuit 3. By way of example, the data may be supplied to the output register 5 from the memory via the input/output circuit 3 using a normal write operation. In addition, the test data can be supplied to the output register 5 at reduced speed using a normal write process. Furthermore, the test data can be written to the output register 5 in a special test data write mode.

The second embodiment has a memory 1 in which, in a further embodiment, the evaluation circuit 21 performs a signature comparison for the data which have been read by the input/output circuit 3 in the test mode and data which have been returned to the input register 6 via the output register 5. For the signature comparison, it is possible to use a multiple input signature register (MISR circuit). The calculation of signatures using MISR circuits is known and is therefore not described further at this juncture. The signature used may be a checksum, for example, which is dependent on the test data. The checksum may be stored in the comparison data store 22.

The test data may be stipulated such that the test data respectively produce the same checksum as a serial test data stream for a stipulated number of test data items. It is therefore not necessary to perform exact time alignment between the test data and the comparison of the result data with the comparison data. With these test data, it is sufficient if the evaluation circuit 21 checks a stipulated number of test data items, which are supplied to the input register 6 by the input/output circuit via the output register and the data link 14 during test processes, against the known checksum for the stipulated number of test data items. Apart from the use of a signature comparison or of a checksum for checking the correct operation of the memory 1, the memory 1 in FIG. 2 is designed on the basis of FIG. 1 and also operates as in FIG. 1. For simplified illustration, only parts of the memory 1 which are required for understanding are shown.

Figure 3:
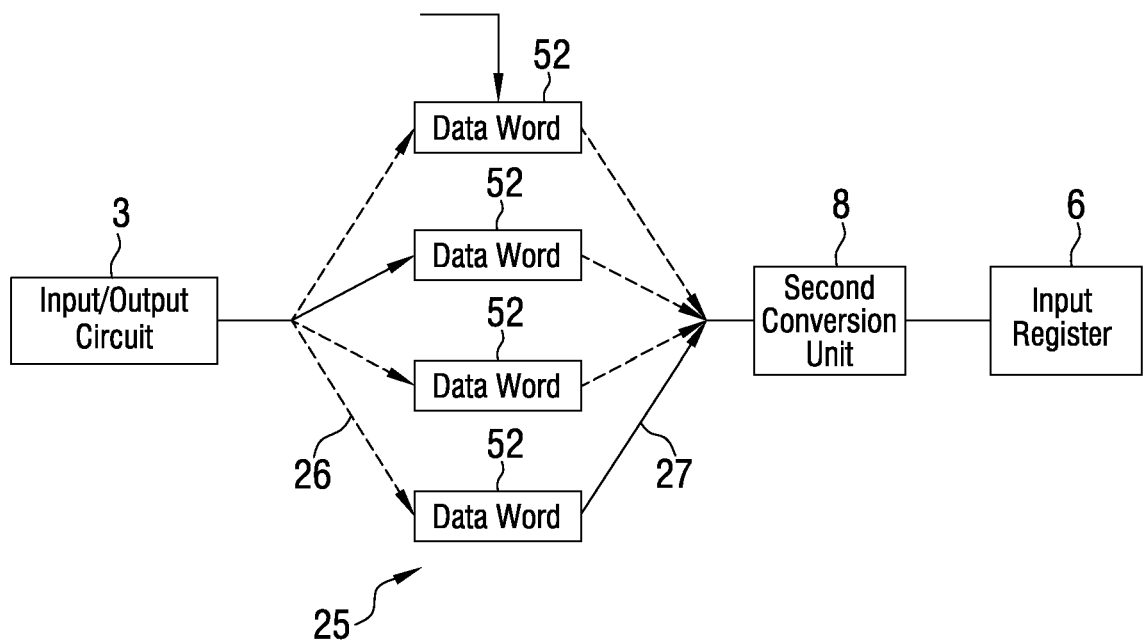
FIG. 3 shows a schematic illustration of a FIFO memory as output register.

FIG. 3 shows another embodiment, in which the input/output circuit 3 is connected to an output register in the form of an FIFO memory 25. In this embodiment, the FIFO memory 25 has a depth of four data words. A data word 52 has a plurality of data bits, for example eight data bits. The FIFO memory 25 is connected to the input/output circuit 3 via an input pointer 26 and to a second conversion unit 8 via an output pointer 27. In the test mode, the four data words 52 from the FIFO memory 25 are first of all filled in order with test data by the input/output circuit 3. Next, the test data of the data words 52 from the FIFO memory 25 are supplied in order to the second conversion unit 8 via the output pointer 27, and the conversion unit converts the data length of the data from a serial data stream into a parallel data stream and forwards it to the input register 6. The input register 6 forwards the data to the input/output circuit 3, which processes the test data further on the basis of the prescribed test process. In this way, test data can easily be made available as a serial data stream.

Figure 4:
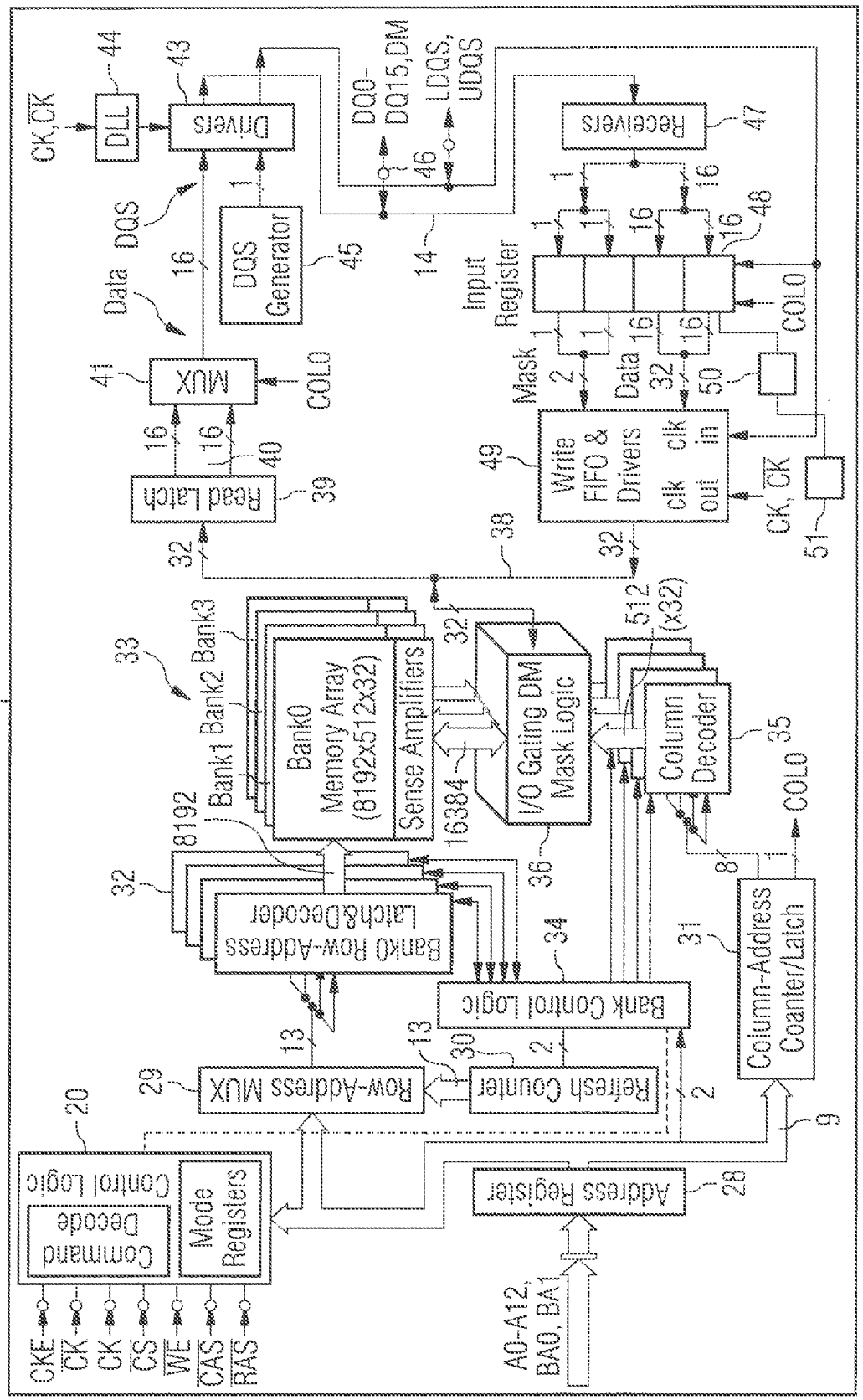
FIG. 4 shows a schematic circuit design for a memory based on the invention in the form of a DRAM.

FIG. 4 shows a schematic illustration of a memory in the form of a DRAM 53 which has a control circuit 20, an address register 28, a row address multiplexer 29, a refresh counter 30 and a column address counter 31. In addition, four row address decoders 32 are provided for four memory banks 33. Furthermore, a bank control circuit 34 is provided. Also, a column decoder circuit 35 is provided, which is connected to a second input/output circuit 36. The second input/output circuit 36 is connected to each memory bank 33 via amplification circuits 37. The second input/output circuit 36 is connected to a second output register 39 by means of a second data bus 38. The second output register 39 is connected to a multiplexer 41 by means of a plurality of data lines 40. The multiplexer 41 is connected to a second output driver 43 by means of a further data line 42. The second output driver 43 is connected to a clock generator 44. In addition, a DQS generator 45 is provided which is connected to the second output driver 43. The second output driver 43 is connected to inputs/outputs 46 by means of output lines. In addition, the inputs/outputs 46 are connected to a second receiver circuit 47. Furthermore, the second output driver 43 is connected directly to the second receiver circuit 47 by means of a data link 14. The second receiver circuit 47 is connected to a buffer store 49 having driver circuits via a second input register 48. The buffer store 49 is connected to the second data bus 38.

In addition, the second input register 48 is connected to a second evaluation circuit 50. In a further embodiment, the second evaluation circuit 50 is connected to a second comparison data store 51.

The DRAM store 53 shown in FIG. 4 executes the test process in the same manner as already described with reference to FIGS. 1 and 2. In a test mode, test data are written to the second output register 39. In a first embodiment, these test data are read from memory cells in one of the memory banks 33 by the second input/output circuit 36 and are written to the second output register 39 via the second data bus 38. In this case, the output register 39 is in the form of a FIFO memory, for example. The FIFO memory has a plurality of data words which are described in order by the second input/output circuit 36. Next, the test data stored in the second output register 39 are written to the second input register 48 cyclically via the multiplexer 41, the second output driver 43 and the second receiver circuit 47. The test data from the second input register 48 are then used via the buffer store 49 and the second input/output circuit 36 for stipulated test processes in one of the memory banks 33. In a simple test process, the test data are stored in stipulated memory cells. In a further process step of the test mode, the test data are read as result data from the stipulated memory cells again and are written to the second input register 48 via the second output register 49, the multiplexer 41, the second output driver 43 and via the second receiver circuit 47. The result data are then checked by the second evaluation circuit 50. This involves examining, by way of example, whether the result data correspond to stipulated comparison data or have a stipulated signature or a stipulated checksum. The stipulated comparison data, the stipulated signature and/or the stipulated checksum are stored in a second comparison data store 51, for example, which is connected to the second evaluation circuit 50. If the result of the comparison is that the result data do not match the comparison data or the stipulated signature or the stipulated checksum then a malfunction in the memory is identified and an output signal is output by the second evaluation circuit 50.

Figure 5:
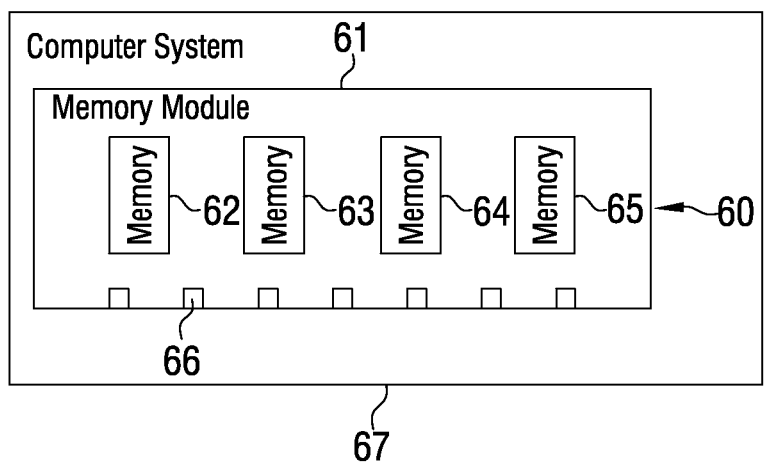
FIG. 5 shows a memory module.

FIG. 5 depicts a memory module 60 with several memories 62, 63, 64, 65 that are arranged on a printed circuit board 61. Each of the memories 62, 63, 64, 65 is electrically connected with module contacts 66 to exchange signals and/or data.

Figure 6:
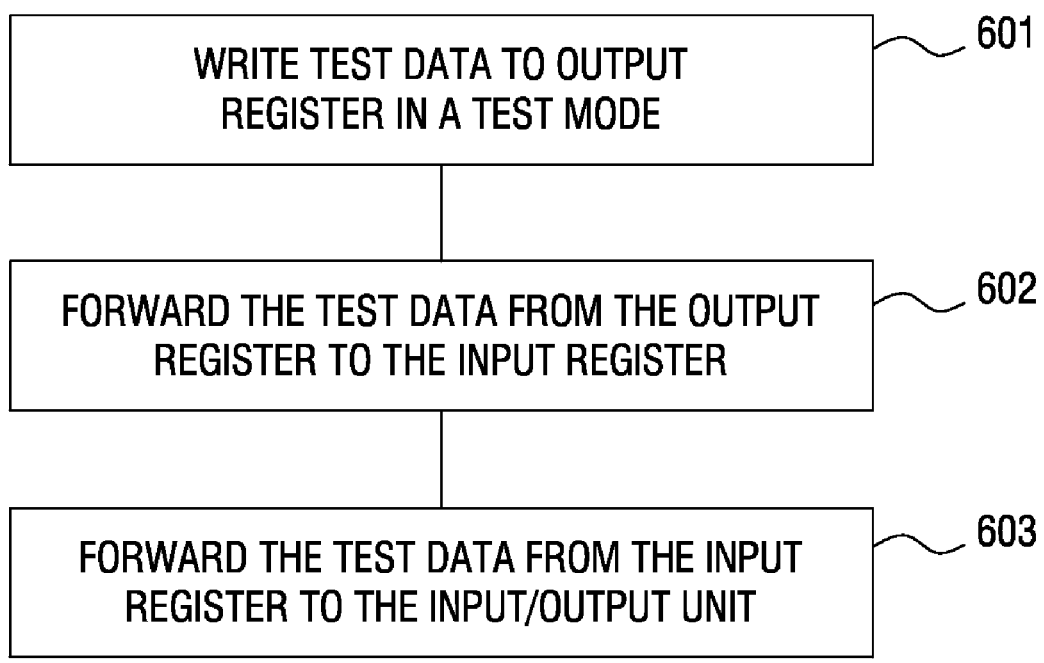
FIG. 6 shows a flow diagram of a process for testing a memory chip.

FIG. 6 shows a flow diagram of a process for testing a memory chip. The memory chip may include (1) a memory array comprising memory cells, and (2) an input/output unit which is connected to an output register and to an input register. The process generally comprises writing test data to the output register in a test mode in step 601, forwarding the test data from the output register to the input register in step 602, and forwarding the test data from the input register to the input/output unit in step 603. The test data may thereafter be used by the input/output unit for a test process.

The memory module may be part of a computer system 67.

The memory module may be embodied as a dual in line memory module or as a single in line memory module for example.

While the foregoing is directed to embodiments of the present invention, other and further embodiments of the invention may be devised without departing from the basic scope thereof, and the scope thereof is determined by the claims that follow.

What is claimed is:

1. A memory, comprising:
   a memory array comprising memory cells,
   an input/output circuit which is connected to the memory cells and which interchanges data with the memory cells,
   an output register which is connected to the input/output circuit, the output register being used to output data via a data output,
   an input register which is connected to a data input and to the input/output circuit, the data input and the input register being used to input data into the memory cells, wherein test data is written to the output register in a test mode, wherein the output register is connected to the input register, wherein the output register forwards the test data to the input register in the test mode and the test data is transmitted from the input register to the input/output circuit, wherein the input/output circuit (i) writes the test data received from the input register to stipulated memory cells, (ii) reads the stipulated memory cells again and (iii) outputs them to the output register, wherein the output register supplies the data which have been read from the stipulated memory cells to the input register, and
   an evaluation circuit connected to the input register, wherein the evaluation circuit checks the processing of the test data by the input/output circuit.

2. The memory as claimed in claim 1, wherein the test data are read from the memory array by the input/output unit and are transmitted to the output register.

3. The memory as claimed in claim 1, wherein the output register forwards the stored test data to the input register in cyclic succession in the test mode.

4. The memory as claimed in claim 1, wherein the evaluation circuit compares the data from the stipulated memory cells with comparison data and outputs an error signal if there is a discrepancy.

5. The memory as claimed in claim 1, wherein the evaluation circuit checks the data from the stipulated memory cells for a signature.

6. The memory as claimed in claim 1, wherein the evaluation circuit is connected to an error register, and wherein the evaluation circuit stores an error data item in memory if a malfunction is identified.

7. The memory as claimed in claim 1, wherein the memory is a synchronous memory which outputs the data from memory cells to the output register under the clocking of a clock signal, wherein the output register supplies the data to the input register in clocked fashion, and wherein the input register transfers the data to the input/output circuit in clocked fashion.

8. The memory as claimed in claim 7, wherein the memory is in the form of a dynamic RAM store.

9. The memory as claimed in claim 1, wherein the output register is in the form of a FIFO memory.

10. The memory as claimed in claim 9, wherein the FIFO memory has an input pointer which takes a clock signal as a basis for connecting the input/output circuit to one of a plurality of data words, wherein the FIFO memory has an output pointer which connects one of the data words to an output of the FIFO memory, and wherein in the test mode the FIFO memory outputs the test data of the data words in cyclic succession.

11. The memory as claimed in claim 1, wherein the output register is connected to the input register directly by means of data lines.

12. A process for testing a memory chip comprising (1) a memory array comprising memory cells, and (2) an input/output unit which is connected to an output register and to an input register, the process comprising:
   writing test data from the input/output unit to the output register in a test mode,
   forwarding the test data from the output register to the input register,
   forwarding the test data from the input register to the input/output unit, wherein the test data is used by the input/output unit for a test process, and
   checking result data which are obtained after the performance of the test process and which are forwarded from the input/output unit to the input register via the output register, wherein the checking is performed by an evaluation unit connected to the input register.

13. The process as claimed in claim 12, wherein the test data are written to the output register when the test mode is started and are then routed in succession as a serial data stream to the input register.

14. A memory module, comprising:
   a memory array comprising memory cells,
   an input/output circuit which is connected to the memory cells and which interchanges data with the memory cells,
   an output register which is connected to the input/output circuit, wherein the output register is used to output data via a data output,
   an input register which is connected to a data input and to the input/output circuit, wherein the data input and the input register is used to input data into the memory cells, wherein test data is written to the output register in a test mode, wherein the output register is connected to the input register, wherein the output register forwards the test data to the input register in the test mode, the test data being transmitted from the input register to the input/output circuit, wherein the input/output circuit (i) writes the test data received from the input register to stipulated memory cells, (ii) reads the stipulated memory cells again and (iii) outputs them to the output register, wherein the output register supplies the data which have been read from the stipulated memory cells to the input register, and
   an evaluation circuit connected to the input register, wherein the evaluation circuit checks the processing of the test data by the input/output circuit.

15. A computer system, comprising:
   a memory array comprising memory cells,
   an input/output circuit which is connected to the memory cells and which interchanges data with the memory cells,
   an output register which is connected to the input/output circuit, with the output register being used to output data via a data output,
   an input register which is connected to a data input and to the input/output circuit, wherein the data input and the input register are used to input data into the memory cells, where in test data being written to the output register in a test mode, wherein the output register is connected to the input register, wherein the output register forwards the test data to the input register in the test mode, the test data being transmitted from the input register to the input/output circuit, wherein the input/output circuit (i) writes the test data received from the input register to stipulated memory cells, (ii) reads the stipulated memory cells again and (iii) outputs them to the output register, wherein the output register supplies the data which have been read from the stipulated memory cells to the input register, and
   an evaluation circuit connected to the input register, wherein the evaluation circuit checks the processing of the test data by the input/output circuit.

* * * * *